United States Patent
Knapp

(10) Patent No.: US 6,935,556 B2
(45) Date of Patent: Aug. 30, 2005

(54) METHOD FOR MOUNTING ELECTRONIC COMPONENTS ON SUBSTRATES

(75) Inventor: Wolfgang Knapp, Lenzburg (CH)

(73) Assignee: ABB Research Ltd., Zurich (CH)

( * ) Notice: Subject to any disclaimer, the term of this patent is extended or adjusted under 35 U.S.C. 154(b) by 295 days.

(21) Appl. No.: 10/192,630

(22) Filed: Jul. 11, 2002

(65) Prior Publication Data
US 2003/0016510 A1 Jan. 23, 2003

(30) Foreign Application Priority Data
Jul. 18, 2001 (EP) .............................. 01810711

(51) Int. Cl.⁷ .............................................. B23K 31/02
(52) U.S. Cl. .................................. 228/248.1; 228/233.1
(58) Field of Search ........................ 228/44.7, 182, 228/212, 233.1, 248.1; 361/761; 29/840

(56) References Cited

U.S. PATENT DOCUMENTS

| 3,608,809 A | 9/1971 | Cushman |
| 4,243,169 A * | 1/1981 | Sara ............................ 228/175 |
| 4,856,185 A * | 8/1989 | Baumgartner et al. ......... 29/840 |
| 5,352,629 A | 10/1994 | Paik et al. |
| 5,632,434 A * | 5/1997 | Evans et al. ................ 228/44.7 |
| 5,893,511 A * | 4/1999 | Schwarzbauer ............. 228/194 |
| 6,250,907 B1 | 6/2001 | Bergman |

FOREIGN PATENT DOCUMENTS

| EP | 0330895 A2 | 9/1989 |
| EP | 0460286 A2 | 12/1991 |
| JP | 1309343 | 12/1989 |

* cited by examiner

Primary Examiner—Jonathan Johnson
(74) Attorney, Agent, or Firm—Burns, Doane, Swecker & Mathis, LLP

(57) ABSTRACT

In the method for mounting electronic components on substrates by means of pressure sintering, a paste which is composed of a metal powder and a solvent is applied between the component and the substrate. Once the paste has dried completely, the component is placed on the substrate. A number of such arrangements (4) together with a substrate and component are then compressed at the sintering temperature in an isostatic press (6). A large number of complex and/or fragile parts can be connected at the same time, and with very high precision.

19 Claims, 2 Drawing Sheets a)

b)

METHOD FOR MOUNTING ELECTRONIC COMPONENTS ON SUBSTRATES

FIELD OF THE INVENTION

The present invention relates to the field of power electronics, and relates in particular to a method for mounting electronic components on substrates by means of pressure sintering.

BACKGROUND OF THE INVENTION

A pressure sintering method such as this is known from EP 0 330 895 B 1. In this case, an arrangement comprising a substrate and a power-electronic component is introduced into a press with two pressing dies. An elastically deformable body composed of temperature-resistant material is arranged between the top face of the component and the one pressing die. The deformable body transmits the pressure during the pressing process more uniformly over the parts to be connected to one another.

However, if the shapes of the parts to be connected are relatively complicated, the deformable body is generally not flexible enough to transmit the pressure uniformly over the entire actual surface area. Thermal expansion of the deformable body can, furthermore, lead to movements of the parts to be connected and/or to breakages of the components, which are also highly fragile.

SUMMARY OF THE INVENTION

In consequence, the object of the present invention is to provide a method of the type mentioned initially, by means of which even components with a structured or fissured top face can be mounted on a substrate without any mechanical damage being caused to the component.

According to the invention, the object is achieved by the features of the independent claim 1.

In the method according to the invention, the arrangement together with a component and substrate is introduced into a pressure chamber of an isostatic press for compression, and is compressed therein by means of a fluid which is at a raised pressure.

The fluid results in an absolutely uniform pressure being exerted on the arrangement to be compressed, without in the process causing any mechanical stresses which could lead to damage to the component.

In one preferred embodiment of the method according to the invention, before the pressing process, the arrangement is introduced into an elastically deformable, gastight cover, and this is then closed.

The gastight cover ensures that the fluid cannot penetrate between the parts to be connected, and/or that the parts to be connected are not themselves damaged by the fluid. The cover is also used to protect the arrangement during storage and transport.

It is particularly advantageous for the cover, together with the arrangement, to be evacuated before the compression process. In consequence, the parts to be connected are fixed relative to one another, which once again simplifies storage and transport.

In addition, a number of such arrangements with a component and substrate can be compressed at the same time in one pressure chamber. This increases the throughput rate, with the connections that are produced having an absolutely constant quality.

BRIEF DESCRIPTION OF THE DRAWINGS

The invention will be explained in more detail in the following text with reference to the drawings, in which.

DETAILED DESCRIPTION OF THE INVENTION

The major method steps of the method according to the invention will be explained with reference to FIG. 1 and FIGS. 2a) and b). The illustrations are in the form of sketches, and the length relationships are not to scale.

Figure 1:
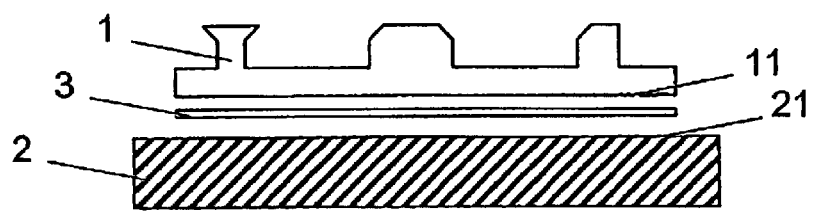
FIG. 1 shows a cross section of an arrangement which is suitable for carrying out the method according to the invention, with an electrical component and a substrate, FIGS. 2a) and b) show major steps in one preferred embodiment of the method according to the invention, with an arrangement as shown in FIG. 1.

FIG. 1 shows an electrical component 1, which is intended to be mounted on a mount substrate 2.

The component 1 may, for example, be a semiconductor component (thyristor, GTO, IGBT) with a number of contact and/or control electrodes located at the top. The various electrodes lead to a more or less highly contoured surface. The bottom face 11 of the component is coated with a contact-making layer.

The substrate is, for example, a 1.5 mm thick wafer composed of molybdenum with a diameter of approximately 30 mm. This is provided, at least on the side facing the component 1, with a contact layer 21, which has a thickness of approximately 2 to 3_m and is composed, by way of example, of silver.

In order to mount the component on the contact layer 11 of the component and/or on the contact layer 21 of the substrate, a sintering layer 3 is applied, composed of metal powder, in particular silver powder. The sintering layer 3 may, by way of example, be applied in the form of a paste, which is composed essentially of the silver powder and a solvent. This paste is dried after application, by forcing out the solvent. The drying time at room temperature is approximately 30 minutes. The drying time is reduced to a few minutes if the temperature is raised.

The component 1 is then placed on the substrate 2.

Figure 2:
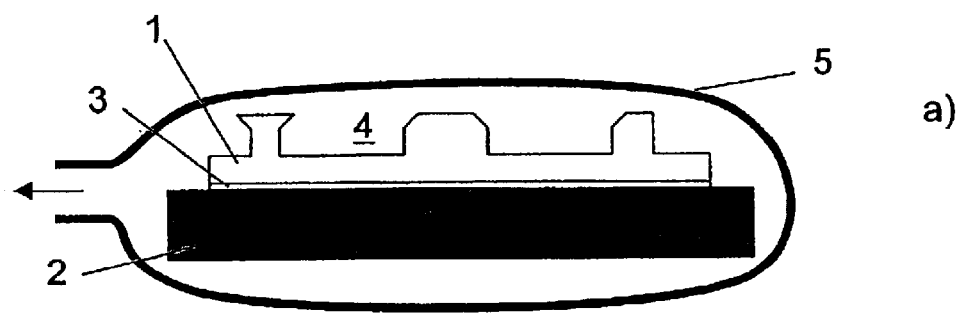
Figure 2:
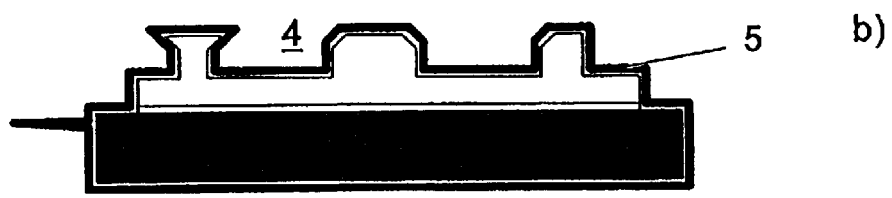

As FIG. 2a) shows, the arrangement 4 formed from the parts that have been placed one on top of the other is introduced into a gastight, elastic plastic cover 5, which is then at least partially evacuated and is closed. The elastic cover closely follows the contours of the arrangement, as is illustrated in FIG. 2b). The evacuation of the cover additionally stabilizes the arrangement. In consequence, the component and substrate cannot move before or during the pressing process.

The cover is manufactured from a material with high thermal conductivity, for example silicon rubber or compressed PTFE film, which has been found to be particularly suitable in trials.

As an alternative to the introduction of the arrangement into a cover, it is also possible to seal only the contact area between the component and the substrate, using a protective layer composed, for example, of rubber paste.

Figure 3:
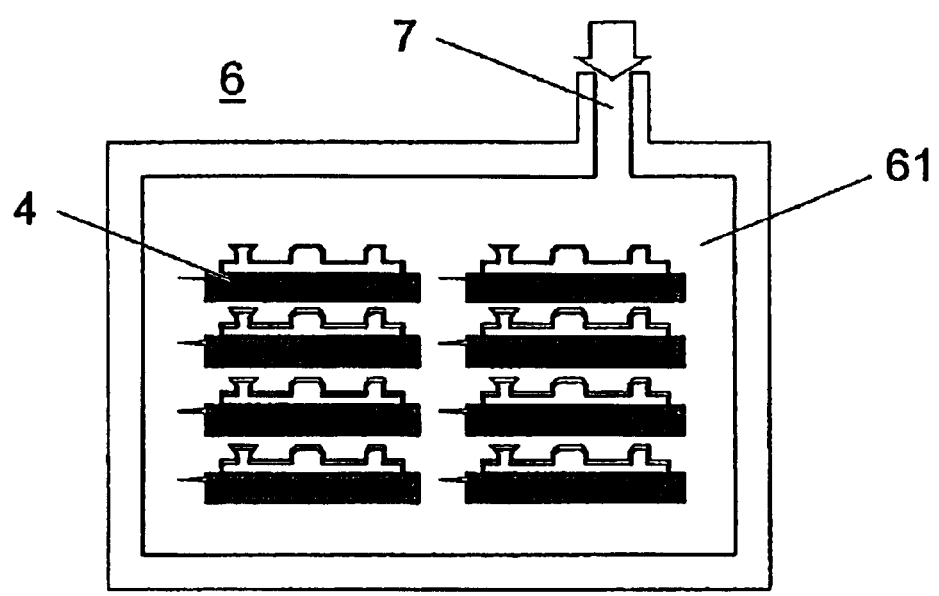
FIG. 3 shows the arrangement as shown in FIG. 1, during the pressure transmission.

As FIG. 3 shows, a number of such arrangements 4 are then introduced into the pressure chamber 61 of an isostatic press 6. An isostatic press such as this is known, for example, from U.S. Pat. No. 6,250,907.

The pressure in the pressure chamber is produced by a fluid (liquid or gas) 7, which is pressed into the pressure chamber 61 at a raised pressure. The fluid is heated to a sintering temperature between 150 and 250° C. before, during and/or after being introduced into the pressure chamber.

A good connection is achieved by exerting a pressure of approximately 4000 N/cm$^2$ on the arrangement for a sintering time of a few seconds up to 60 seconds.

The sintering time is reduced by raising the pressure and/or the sintering temperature.

For safety reasons, pressure fluids are advantageously used whose boiling temperature at the given pressure is above the sintering temperature (for example GALDEN HT, boiling temperature 309° C.).

After the sintering process, the arrangement is removed from the elastic cover once again.

List of Reference Symbols

1 Electronic component
11 Contact-making layer, boundary surface
2 Mount subsrate
21 Contact-making layer
3 Sintering layer
4 Arrangement together with component and substrate
5 Cover, membrane
6 Press
61 Pressure chamber
7 Fluid (gas, liquid)

What is claimed is:

1. A method for mounting electronic components on substrates by means of pressure sintering, the method comprising:
    applying a sintered layer, which comprises a metal powder, to a boundary surface of a component provided with a contact-making layer, to a contact layer of a substrate, or to both the boundary surface and the contact layer;
    placing the boundary surface of the component on the contact surface of the substrate;
    introducing the arrangement comprising the substrate and component into an elastically deformable, gastight cover;
    closing the cover;
    introducing the arrangement into a pressure chamber of an isostatic press for compression; and
    isostatically compressing the arrangement in the pressure chamber at sintering temperature by means of a liquid which is at a raised pressure.

2. The method as claimed in claim 1, wherein
    the cover with the arrangement is at least partially evacuated before the compression process.

3. The method as claimed in claim 1, wherein a number of arrangements together with a substrate and component are compressed in one pressure chamber.

4. The method as claimed in claim 1, wherein the sintering layer is applied to the boundary surface.

5. The method as claimed in claim 1, wherein the sintering layer is applied to the contact layer.

6. The method as claimed in claim 1, wherein the sintering layer is applied to both the boundary surface and the contact layer.

7. The method as claimed in claim 1, wherein the component is a semiconductor component.

8. The method as claimed in claim 7, wherein the substrate is a wafer.

9. The method as claimed in claim 8, wherein the wafer is of molybdenum.

10. The method as claimed in claim 8, wherein the contact layer is of silver.

11. The method as claimed in claim 1, wherein the sintering layer is of silver.

12. The method as claimed in claim 1, wherein the component and substrate are prevented from moving before and during compressing of the arrangement by the cover.

13. The method as claimed in claim 1, wherein the cover is composed of silicon rubber or a compressed PTFE film.

14. The method of claim 1, wherein the sintering temperature is between 150° C. and 250° C.

15. A method for mounting electronic components on substrates by pressure sintering, the method comprising:
    providing an arrangement comprising a component, a substrate and a sintering layer comprising a metal powder disposed between and in contact with the component and the substrate;
    introducing the arrangement into an elastically deformable, gastight cover;
    closing the cover;
    introducing the arrangement into a pressure chamber of an isostatic press; and
    isostatically compressing the arrangement in the pressure chamber at sintering temperature using a liquid at a raised pressure and the sintering temperature.

16. The method as claimed in claim 15, wherein the cover with the arrangement is at least partially evacuated before compressing the arrangement.

17. The method as claimed in claim 15, wherein the component is a semiconductor component.

18. A method for mounting electronic components on substrates by pressure sintering, the method comprising:
    providing an arrangement comprising a component, a substrate and a sintering layer comprising a metal powder disposed between and in contact with the component and the substrate;
    introducing the arrangement into an elastically deformable, gastight cover;
    at least partially evacuating the cover with the arrangement and closing the cover;
    introducing the arrangement into a pressure chamber of an isostatic press; and
    isostatically compressing the arrangement in the pressure chamber at sintering temperature using a liquid which is at a raised pressure.

19. The method as claimed in claim 18, wherein the component is a semiconductor component.

* * * * *